United States Patent [19]

Weber

[11] Patent Number: 4,559,637
[45] Date of Patent: Dec. 17, 1985

[54] TAMPER PROOF DIGITAL VALUE ACCUMULATOR AND DISPLAY METHOD AND APPARATUS

[76] Inventor: Harold J. Weber, P.O. Box 315, 20 Whitney Dr., Sherborn, Mass. 01770

[21] Appl. No.: 531,417

[22] Filed: Sep. 12, 1983

[51] Int. Cl.⁴ .................... H03K 21/30; G06F 15/20; G06F 11/00

[52] U.S. Cl. ........................................ 377/24; 377/20; 364/467; 364/561; 364/431.12; 365/228

[58] Field of Search ................... 364/561, 467, 431.12, 364/900, 200; 377/24, 20; 365/228

[56] References Cited

U.S. PATENT DOCUMENTS

| | | | |
|---|---|---|---|
| 3,865,305 | 2/1975 | Sampey | 377/24 |
| 4,031,363 | 6/1977 | Freeman et al. | 377/24 |
| 4,234,920 | 11/1980 | Van Ness et al. | 364/200 |
| 4,263,657 | 4/1981 | Oka et al. | 377/24 |
| 4,348,729 | 9/1982 | Sasayama et al. | 364/900 |
| 4,388,706 | 6/1983 | Butler | 365/228 |
| 4,458,307 | 7/1984 | McAnlis et al. | 365/228 |

Primary Examiner—John S. Heyman

[57] ABSTRACT

The totalized count obtained from a seriate train of signal pulses is stored in a programmable memory means as a permanent state change in a separate memory cell for each count increment. Memory economy is had since each count increment preferably is stored in its respective memory cell as a singular bit change. Display of the totalized count is provided, usually as visual digital characters, through decoding and displaying of the memory address byte signal. When power has been interrupted, or the memory address has otherwise been upset, the totalizing counter is reset. It then quickly runs-up, under control of a CLOCK signal, through all the changed state memory cells until the lowest order yet unchanged cell is addressed, whereupon a state detector produces a signal that inhibits the clock and enables the display of the instant memory address thus obtained. Useful application as a permanent, nonresettable motor vehicle odometer is taught, including reservation of some memory space for retention of key indicia, such as a vehicle identification number (VIN), which may be read out to authenticate the vehicle's association with the displayed odometer mileage. A resettable vehicle trip odometer is also inclusively shown. Overall result is a bright digital display odometer indication that has intrinsically permanent, accumulated travel mileage storage and which resists tampering to an extent greater than obtained with ordinary mechanical numeral wheel odometers.

20 Claims, 10 Drawing Figures

TAMPER PROOF DIGITAL VALUE ACCUMULATOR AND DISPLAY METHOD AND APPARATUS

BACKGROUND OF THE INVENTION

Motor vehicles are commonly provided with speedometers which comprise a combination of instant speed and accumulated travel distance indications.

Prior art abounds with instant speed indicators, an example being that of Hayaski, et al. in U.S. Pat. No. 4,368,426.

An odometer providing electronic retention of accumulated travel distance is the subject of my present invention. Ordinarily motor vehicles accumulate travel mileage (or the metric equivalent in kilometers) on a plurality of numeral wheels which are reduction geared to the vehicle drive train to advance in relation to the preferred units of measurement. The widely used "Veeder Root" counter design particularly exemplifies a popular commercial embodiment of this kind of odometer accumulating display.

A train of pulse signals (binary transitions) may be produced by the vehicle drive train, with the interval between pulses being proportional to distance travelled. By way of example, the speed pulses in the mentioned Hayaski patent also provide distance travelled information which might be further processed, as by way of a succession of frequency dividers, etc. The divided down pulses appear as binary signals at the counter outputs which may then be decoded and displayed. While this approach provides an indication of travel distance, it is lacking commercial usefulness in that it does not provide for the permanent retention of mileage. The information is lost when power to the counters is removed (as with a dead vehicle battery, etc.). The counter outputs may also be stored in a supplementary resister which has a source of standby power, yet such storage is still merely semipermanent.

A practitioner of my instant invention will quickly realize that I now provide substantially permanent, irreversible and tamperproof digital storage of each travelled unit of distance, while using a minimum size memory for obtaining adequate storage.

SUMMARY

My invention provides a permanent, tamperproof recording and display of the accumulated tally obtained from counting each of a seriate sequence of irregularly occurring pulse signals. The count is usually obtained by a binary digital counter, whereupon the plural binary output byte signals produced therefrom act to advance the address states of a multicell programmable memory. As each signal pulse occurs, the counter effectively advances the memory address by one cell with the cell comprising preferably one information bit, whereupon the state of the cell is permanently changed. The apparent result in the preferred embodiment is that, as the counter advances, each corresponding bit is recorded as a permanent state change, thus appearing as a progression of bit cell state changes from the least to the most significant memory bits that is tamperproof and nonresettable.

Each memory address byte is also decoded and displayed as preferably a progression of visible characters which correspond with the instant value of the advancing address signal count.

In particular, my invention affords an efficient, low cost motor vehicle odometer storage and display including:

a bright, "digital" type accumulated mileage character display using light emitting diodes, liquid crystals, fluorescent, or gas discharge indicator elements;

substantially permanent, irreversible accumulated odometric distance (mileage) travelled that is stored in the programmable memory;

utilization of the memory space with best economy in that only one BIT is ordinarily required to hold each incremental, unitary change in stored information;

permanent memory space is not necessarily consumed for obtaining semipermanent retention of the less significant distance units (e.g., "tenths" and "units" of mileage);

permanent key data, such as the vehicle identification number, may be covertly retained in some reserved portion of the memory which may be read out to authenticate the match of the memory with the associated vehicle; and, all solid state storage and possibly even readout is provided which enables the manufacture of the odometer as a single, or a few, integrated circuit means thereby lowering cost and enhancing the reliability of performance.

The person having ordinary skill in the art will quickly anticipate other application for my invention where substantially permanent retention and display of some sequential information is desired. in particular, where a long sequence is involved, the advantage afforded by a mere one bit memory cell cost for each stored unit is highly attractive.

Display decoders for numerical information normally operate with Binary Coded Decimal (BCD) format data bytes. Programmable memory address is most economical with straight binary address. Therefore I continue to teach my apparatus to have a binary counter for memory address which is operatively in parallel with a BCD counter for display drive. This provides the most efficient memory usage while providing proper display drive at the slight expense of a few extra digital counter stages.

The programmable memory taught in my preferred embodiment involves fusible link technology as particularly developed by Harris Corporation, Melbourne, Fla. The utilization of other field programmable memory technologies is however clearly within the anticipated scope of my invention, and therefore no limitation to the representative fuseable link technology is implied. The HM76165 is a representative device, affording a 16,384 bit field. Therefore, in an odometer application, if all digit information except units and tenths is stored, the permanent mileage retention capability becomes $$(16,384-1) \times 10 = 163,830 \text{ miles}$$

and when combined with the elsewhere held less significant bits, affords a full odometer distance of 163,839.9 miles. Obtaining the equivalent performance using metric units, e.g. kilometers, is an obvious modification.

Where more economy is desired, even the 'tens' could be treated as a less significant digit along with units and tenths, whereupon a smaller 2,048 bit memory such as the Harris HM 7621 can provide the potential for 204,700 miles of permanent record keeping storage at much lower implementation cost.

The top bits of memory may be usefully reserved for permanent retention of data read in at time of manufacture an associated product to provide secure verification of the newly stored memory data as belonging to that product. In an automotive application, the mandated Vehicle Identification Number (VIN) may be loaded into the reserved upper memory by the vehicle manufacturer at time of vehicle assembly. For example, 256 bits of reserved top memory could retain sixty-four four-bit numeral combinations, or forty-two six-bit alphanumeric combinations, while consuming a tiny fraction of the total available memory space.

Through this preferred recording of the VIN in memory, coupled with marking the memory device with the VIN and other manufacturing batch and part number information, the fraud potential of odometer setback is clearly thwarted. Substitution of a counterfeited memory would be clearly identifiable by law enforcement authorities, if not by the vehicle purchaser/operator.

It is therefore an object of my invention to provide display storage that is permanent.

Another object is to economically store the display information in a programmable memory as a mere one-bit cell cost for each sequential data unit.

Yet another object of my invention is to provide permanent, irreversible and nonerasable memory storage even when power is removed from the memory.

Still another object is to provide efficient binary format storage of BCD readout information.

Another object of the invention provides secure permanent storage of key identifying indicia that may serve to thwart replacement of a stored memory by a counterfeit memory having other data.

A prime commercial purpose for my invention is as a motor vehicle odometer distance accumulator having permanent, tamperproof storage at low cost per unit of distance so stored.

These and other advantages now afforded by my invention will be appreciated by the prudent reader as I now unfold my description.

DESCRIPTION OF INVENTION

Figure 1:
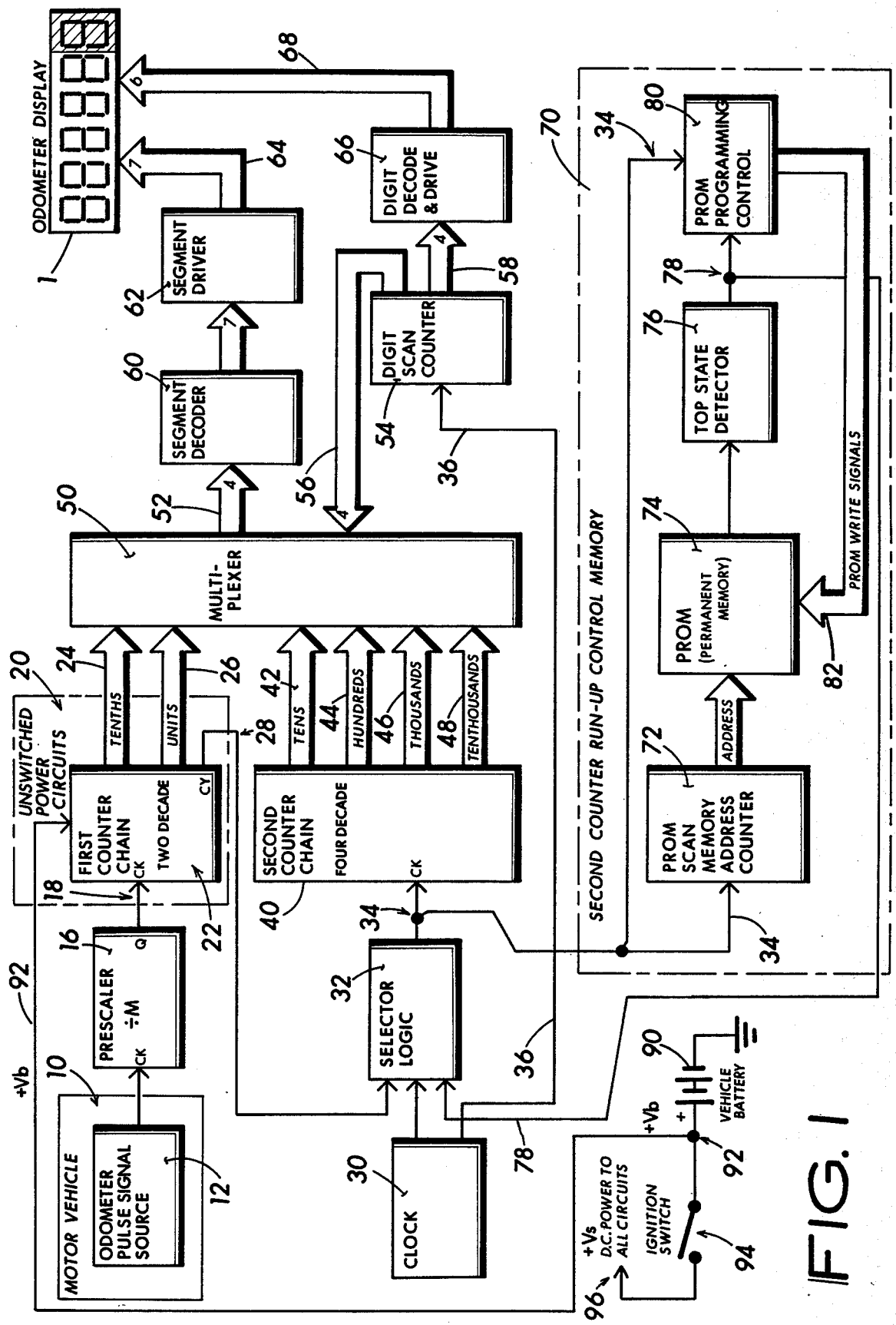
FIG. 1 Block diagram showing overall combination of the invention's essential elements.

The gist of my invention appears in FIG. 1 wherein a motor vehicle 10 an odometer pulse signal source 12 that produces a regular periodic pulse that relates with each unit of distance travelled. A prescaler 16 divides the provided pulse train into a clock pulse on line 18 which typically may have one pulse transition for each one-tenth of a mile traversed. The unswitched power circuit 20 includes a first counter 22 which accepts the clock pulses and divides their frequency, thereby producing "tenths" signals 24, and "units" signals 26 that couple with the multiplexer 50. The "carry" pulse 28 further couples with the selector logic 32, which also has an input coupled with the clock 30. The output of the selector logic 34 couples with the clock input to the second counter chain 40 that produces outputs for "tens" 42, for "hundreds" 44, for "thousands" 46, and for "ten-thousands" 48, all of which correspondingly couple with the multiplexer 50. The output of the multiplexer 52 next couples with a segment decoder 60 and a segment driver 62 which act together to provide signals on lines 64 which drives the display segments of the vehicle odometer display 1. The clock 30 also provides a signal on line 36 that couples with the digit scan counter 54 having two outputs, one on line 56 which drives the multiplexer 50 for selection of each of the six inputs, while the signal on line 58 couples with the digit decode and drive circuit 66 that provides for the repetative synchronous seriate selection of one of the six odometer display digits by way of line 68. Thus the digits on the odometer display 1 are scanned in synchronization with the multiplexer output selection. A vital part of my new invention comprises the Second Counter Run-up Control Memory 70. The clock signal couples with the (programmable memory) PROM scan memory address counter 72, the output of which then couples the address lines of the PROM 74. The PROM provides a one-bit, bit-by-bit storage of each successive count advance of the address counter with the one bit PROM output coupling to the top state detector 76, the purpose for which is to sense the state status of the PROM bit resident at that instantly addressed location. The PROM programming control 80 provides a signal 82 which serves to change the state of each successive bit of the PROM as it is serially addressed, thereby serving to enter a permanent, tamperproof memory retention of the highest state addressed by the counter 72. A signal on line 78 also modifies the selector logic in that as long as CHANGED state (e.g., written) memory bits are received by the top state detector 76, the high speed clock signal (on the order of a few hundred kilohertz) will pass directly to the clock line 34 which serves to rapidly advance the second counter chain and the memory address counter. The instant the first UNCHANGED memory bit is addressed and then read by the detector 76, a signal occurs on line 78 which modifies the selector logic 32 to inhibit clock signal passage therethrough and to allow passage of the carry signal 28. As each carry signal then occurs, it will couple on line 34 to advance the second counter chain by one step and to advance the address counter 72 by one step, i.e., one PROM 74 effective bit, and at the same time the signal 34 coupled with the programming control 80 will serve to produce a write signal which alters the permanent state of the now advanced to bit in the PROM. The vehicle battery 90 provides two d.c. power lines, one being a permanent "ON" line 92 that couples with the unswitched power circuits 20 thereby serving to retain the several bytes of less significant digit information as long as the vehicle battery is connected, whilst the ignition switch 94 provides a path for a source of power 96 for all of the other circuitry associated with the odometer. It will be quickly realized that substantially less PROM memory is required when the less significant first counter chain information is retained by unswitched power, and does not require permanent memory space. The amount of accumulated mileage error potential introduced by this novel method is slight. If the vehicle battery 90 is disconnected, or the first counter chain information is otherwise lost, the maximum error introduced into the accumulated mileage indication will not exceed 9.9 miles. This amount of error is negligible in that it is recognizable by the practicing artisan to be substantially less than the normal accumulation error introduced by the motor vehicle 10 itself due to mechanical variances in drive train gearing, tire size, wheel slip, etc.

Figure 2:
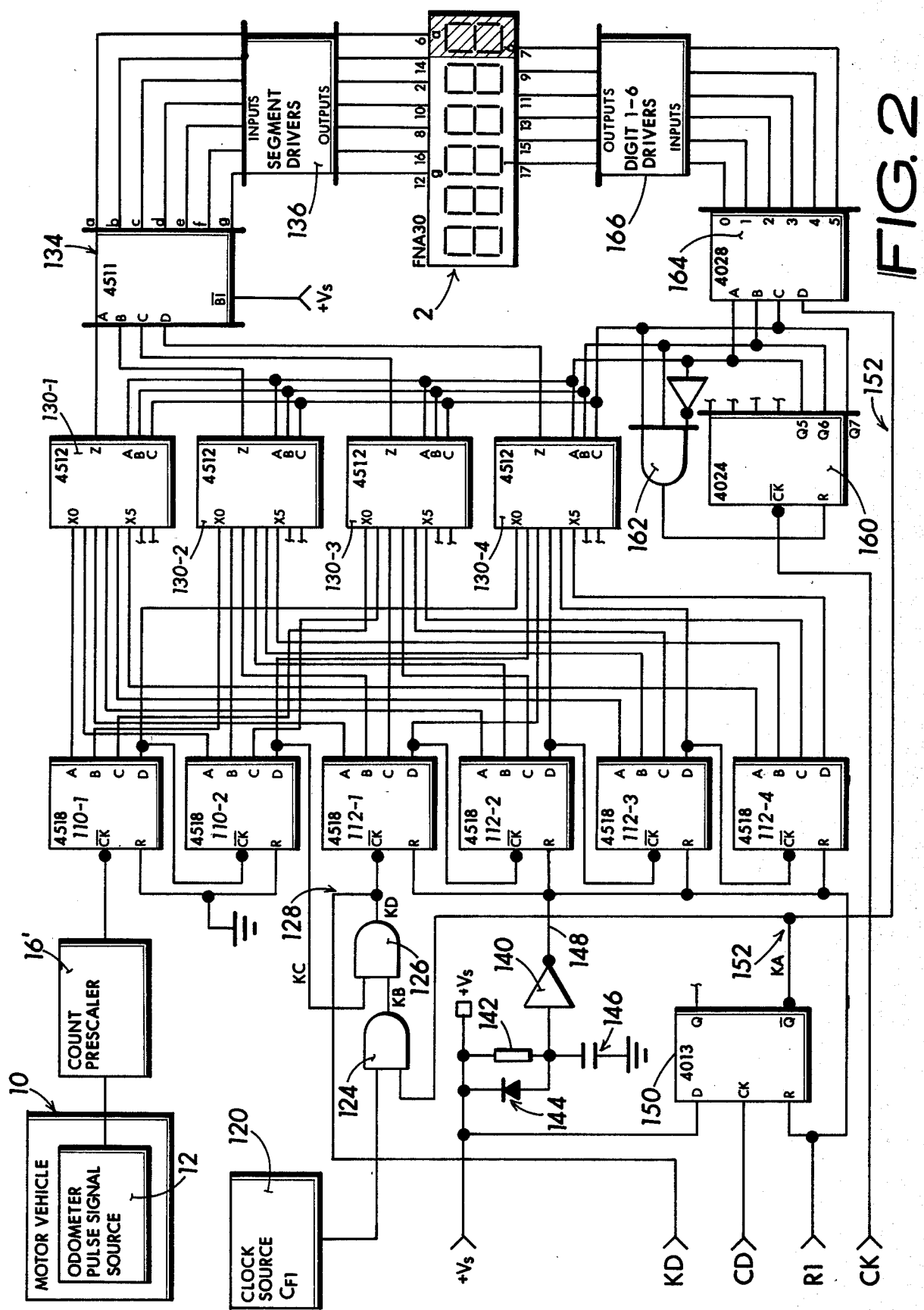
FIG. 2 Electrical diagram showing counters and display in a vehicle odometer application.
Figure 3:
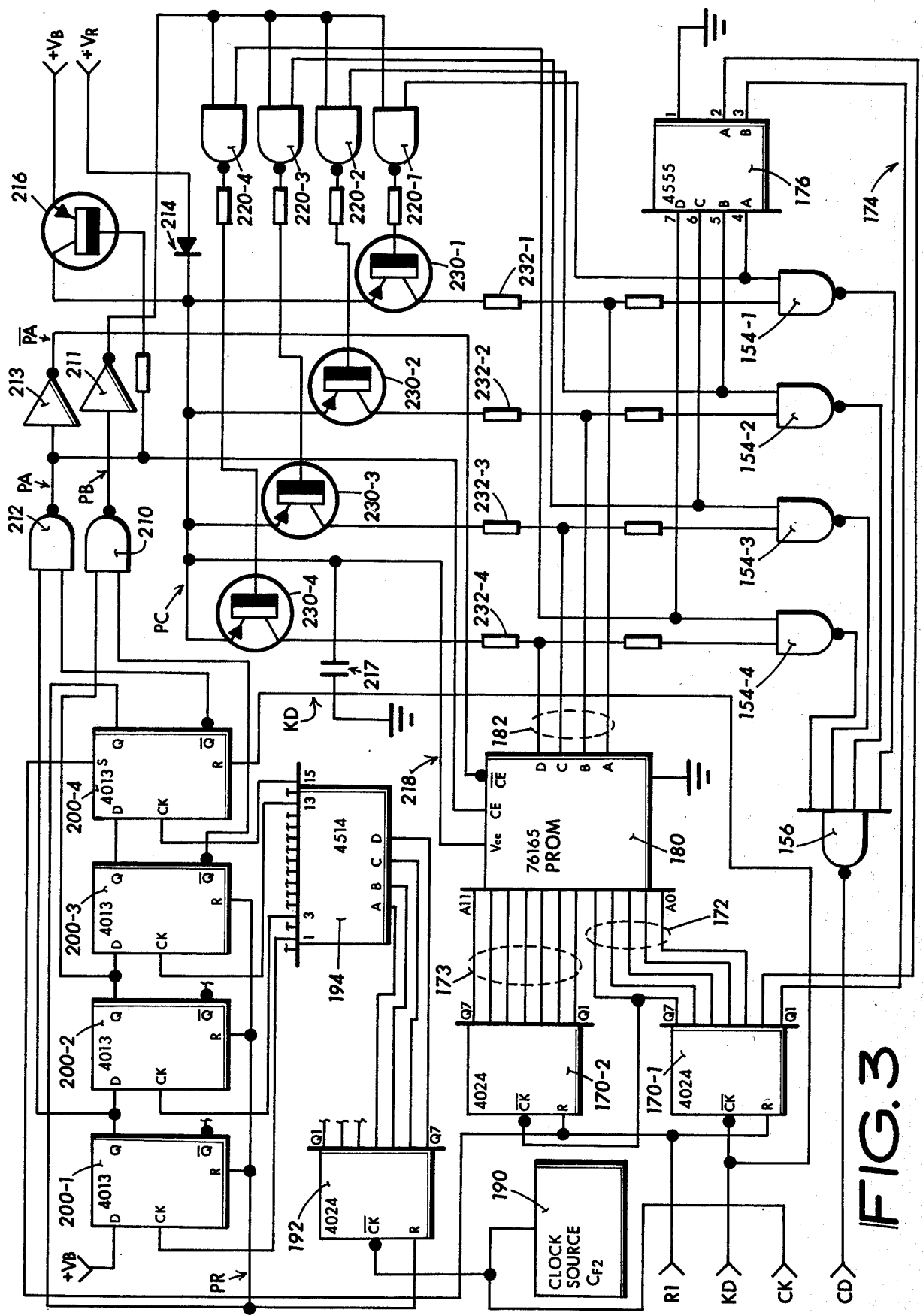
FIG. 3 Electrical diagram continuation showing programmable memory control circuits and memory top state detector.

FIGS. 2 and 3 show the essential electrical hookup for a preferred embodiment teaching the essence of my invention. Motor vehicle 10 includes the pulse signal source 12 which produces the stream of distance pulses which are prescaled 16' and coupled with the BCD counter 110-1 clock input. A counter 110-2 provides the second counting decade, having the clock input thereto connected from the D output of the first counter stage. A clock source 120 is provided, operating with a frequency on the order of a few hundred kilohertz, that couples through AND gates 124, 126 producing a signal at juncture 128 that couples with the clock input of the cascade of BCD counters 112-1, 112-2, 112-3, 112-4. The respective data outputs of each counter stage couple with the correspondent inputs of each of the four "one-of-eight" data line selectors 130-1, 130-2, 130-3, 130-4. The data selector output is then coupled with a decoder 134, segment drivers 136, and subsequently to the exampled Fairchild Semiconductor Corp. type FNA30 display 2.

The inverter 140, including source resistor 142, reset diode 144, and intergrating condenser 146 provides a power-up master RESET signal on line 148 which serves to initialize the four most significant bit counters, the flip-flop 150, and the counters 170-1, 170-2 of FIG. 3 together with the presetting of flip-flop 200-4. The clock 190 produces a clocking signal that couples with counter 160 via the CK line, thereby serving to generate a sequential digit scanning signal at the respective outputs Q5, Q6, Q7, which couples with the A, B, C inputs of the data selectors and with the A, B, C input of the line selector 164 that serves to produce a "digit select" signal coupled through the digit driver 166 and to the display 2. Upon initial turn-on, the clock source 120 signal couples directly to line 128 (the KD line) which rapidly advances the clocking state of counters 112-1, etc., and advances counter 170-1, 170-2 which serves to address the illustrated Harris Corporation 76165 PROM 180. Thus, the PROM outputs 182 couple with the NAND gates 154-1, 154-2, 154-3, 154-4 each having outputs which combine in the NAND gate 156 producing a signal on line CD that couples with the clock input of flip-flop 150. This combination provides the Top State Detector function. Therefore, as long as all the PROM states are LOW on lines 182, as produced after a state change has occurred in the PROM, the respective NAND gates 154-1, 154-2, 154-3, 154-5 will produce HIGH logic levels at the input of NAND gate 156.

The least significant bit Q1, Q2 outputs of counter 170-1 address the A, B, inputs of the selector 176 which serves to demultiplex the A, B, C, D outputs of the PROM thereby treating the parallel PROM output data signal as a one-bit serial signal.

The counter 192, "one-of-sixteen" line selector 194 and the cascade of flip-flops 200-1, 200-2, 200-3, 200-4 together with NAND gates 210, 212 and inverters 211, 213 provide the sequencing pattern signal necessary to prompt the writing of information into the PROM on a bit-by-bit basis. The shown embodiment generally complies with the recommendations of the PROM manufacturer, and includes a transistor 216 which provides a programming voltage +VB (usually +12 volts DC) when the output of gate 212 is LOW. This is illustrated by the PA waveform of FIG. 5. One of the four NAND gates 220-1, 220-2, 220-3, 220-4 is selected by the selector 176. The gate outputs are coupled with the respective transistors 230-1, 230-2, 230-3, 230-4 whereupon the base is drawn LOW, inducing that respective transistor to saturate pulling the juncture coupled with the corresponding current limiting resistor 232-1, 232-2, 232-3, 232-4 HIGH, which serves to fuse a link in the PROM, thereby permanently writing a bit state change at the addressed cell location. The selection of the AND gates is accomplished by the PB signal of FIG. 5 in combination with the data selector of 176 output, while the PA' signal enables PROM 180. Condensor 217 serves to modify the PC pulse waveform to add a slight ramp to the leading and trailing edge as required for best programming. It will be observed that the KD clock signal, as coupled to the reset of flip-flop 200-4 serves to initiate operation in that the Q output PR goes LOW, enabling counter 192 and the flip-flops 200-1, 200-2, 200-3. When the top count state 15 of the decoder 194 is obtained, flip-flop 200-4 is clocked thereby transferring the HIGH state on the input to the Q output. This occurrence serves to reset counter 192 and the flip-flops. The normal operating potential for the PROM 180 is obtained through diode 214 from the logic supply +VR source (typically about 5 volts). The memory top state signals CD, as coupled with the flip-flop 150 input, brings about a transition from the initially reset HIGH state to a LOW state on line KA which jams the flow of clock pulses through AND gate 124 and enables the decoder 164. The result is that the rapid advance of the counter states is inhibited, and only the distance measurement related signal KC may produce an advance. The display will also now turn on.

Figure 4:
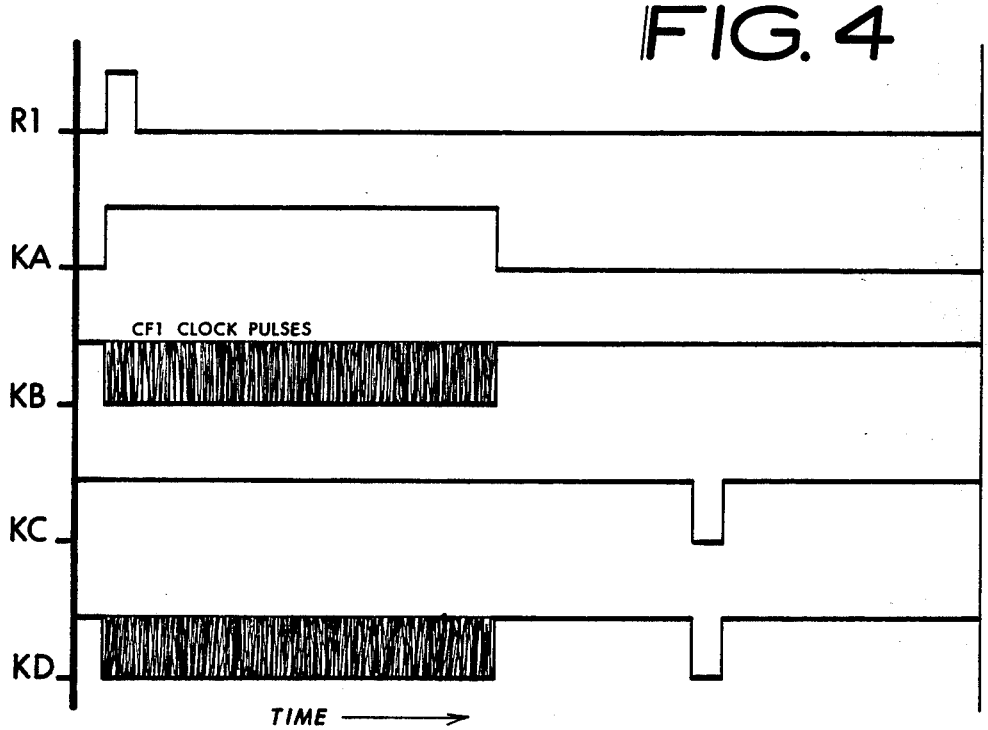
FIG. 4 Waveforms related to circuits of FIG. 2.

FIG. 4 illustrates some of the interactions of the key signals produced by the circuitry of FIGS. 2 and 3. The reset pulse R1 is shown as a brief initializing signal, with the KA line output from the flip-flop 150 going HIGH thus enabling rapid clock pulses KB to be coupled with AND gate 126. Also the distance measurement related carry signal KC from counter 110-2 is shown.

Figure 5:
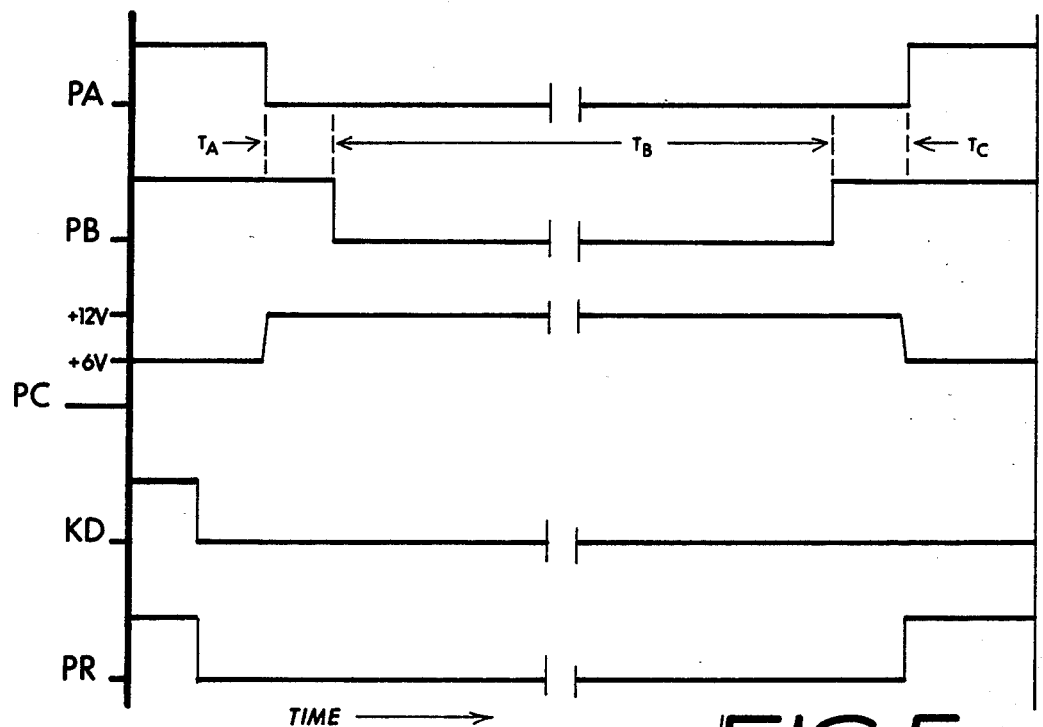
FIG. 5 Waveforms related to circuits of FIG. 3.

FIG. 5 also illustrates the reset control pulse PR as enabling the flip-flops 200-1, etc. The ensuing events leading to the writing of a permanent cell state change into the PROM now starts, with the output PA of gate 212 and output PB of gate 210 determining sequential event timing. The programming voltage shift PC is also shown, changing from about +6 volts to about +12 volts to enable the fusing of the PROM cell memory element.

Figure 6:
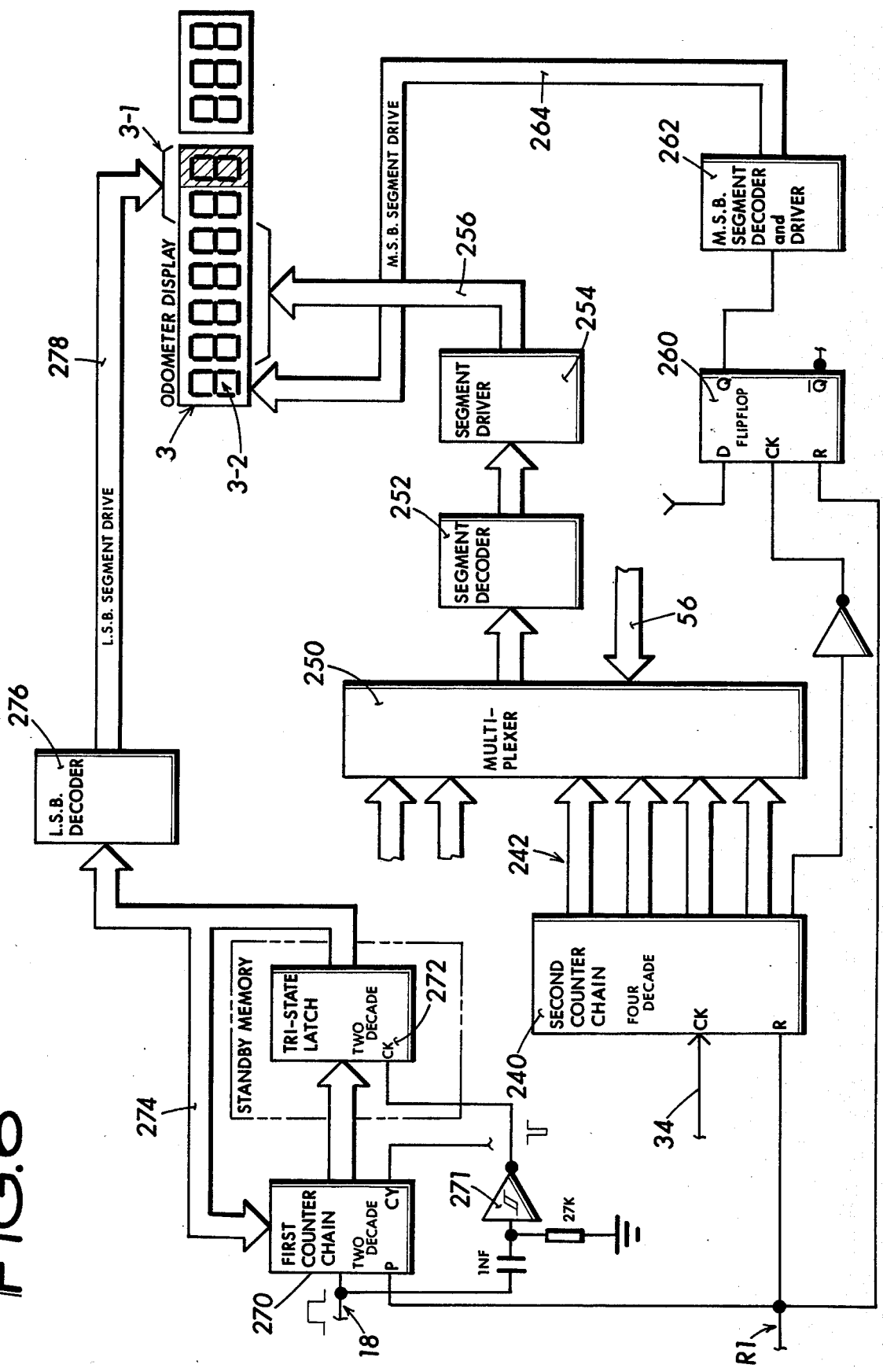
FIG. 6 Block diagram for variation of FIG. 1 having programmable counter loaded from data held in standby memory and limited most significant digit character display drive.

The retention of the first counter data in a tri-state latch which serves as a standby memory now appears in FIG. 6, wherein the counter 270 is provided with a clocking signal 18 which serves to produce an advance through the several decades of count states as previously described for FIG. 1. The clock signal also couples through a differentiator network, including inverter 271, that serves to provide a slightly delayed clock signal to the input of a latch 272. The first counter is therefore allowed to advance, and subsequently the data is loaded into the latch, thus producing an output on bus 274 which reflects the current counter output. When the odometer must be initialized, following a power shutdown, etc., the reset pulse R1 serves to preset the first counter. This loads the data stored on bus 274, and resets the second counter 240 and address counter 72. The top count obtained from the second counter chain 240, i.e. when the most significant "ten thousands" bit "D" produced by the counter chain changes from HIGH to LOW, serves to clock the flip-flop 260, thereby producing a HIGH on the Q ouput as coupled with the segment decoder and driver 262, resulting in a minor digit drive HIGH signal on bus 264 which serves to produce a numeral "1" in the most significant bit position 3-2 of the display 3. The purpose is that since the memory address counter and the PROM 74 can run up to about 163,000 miles, the combination of first and second counter chain decade counters can now also track the memory address counter to the same magnitude, providing full utilization of available memory space.

Figure 7:
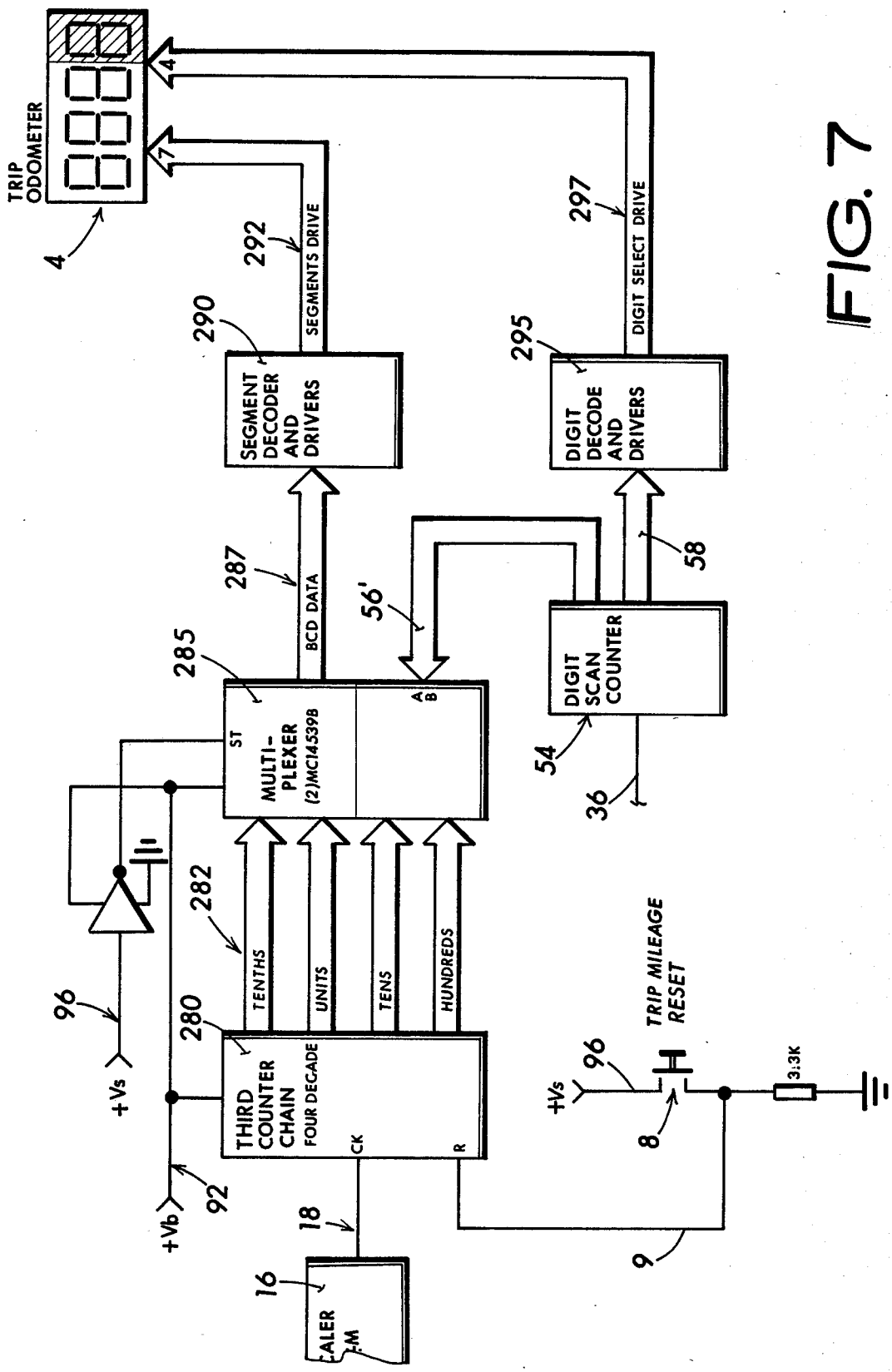
FIG. 7 Block diagram showing TRIP ODOMETER program included with FIG. 1 teaching.

A vehicle trip odometer is shown in FIG. 7 which is resettable by a pushbutton momentary switch 8 actuated by the driver. The switch produces a signal on line 9 which serves to reset the third counter chain 280, comprising typically four decade counters, which are clocked from the vehicle distance signal 18 to produce four count signals 282 which couple with a multiplexer 285 to provide BCD data 287 that is decoded 290 to provide drive 292 to the numeral displays of the trip odometer display 4. The digit scan counter 54 provides the multiplexer address signals 56' and the digit decode signal 58 which couples with the digit decoder and driver 295, producing digit select drive signal 297 which serves to sequentially pick one of the four display numerals.

Figure 8:
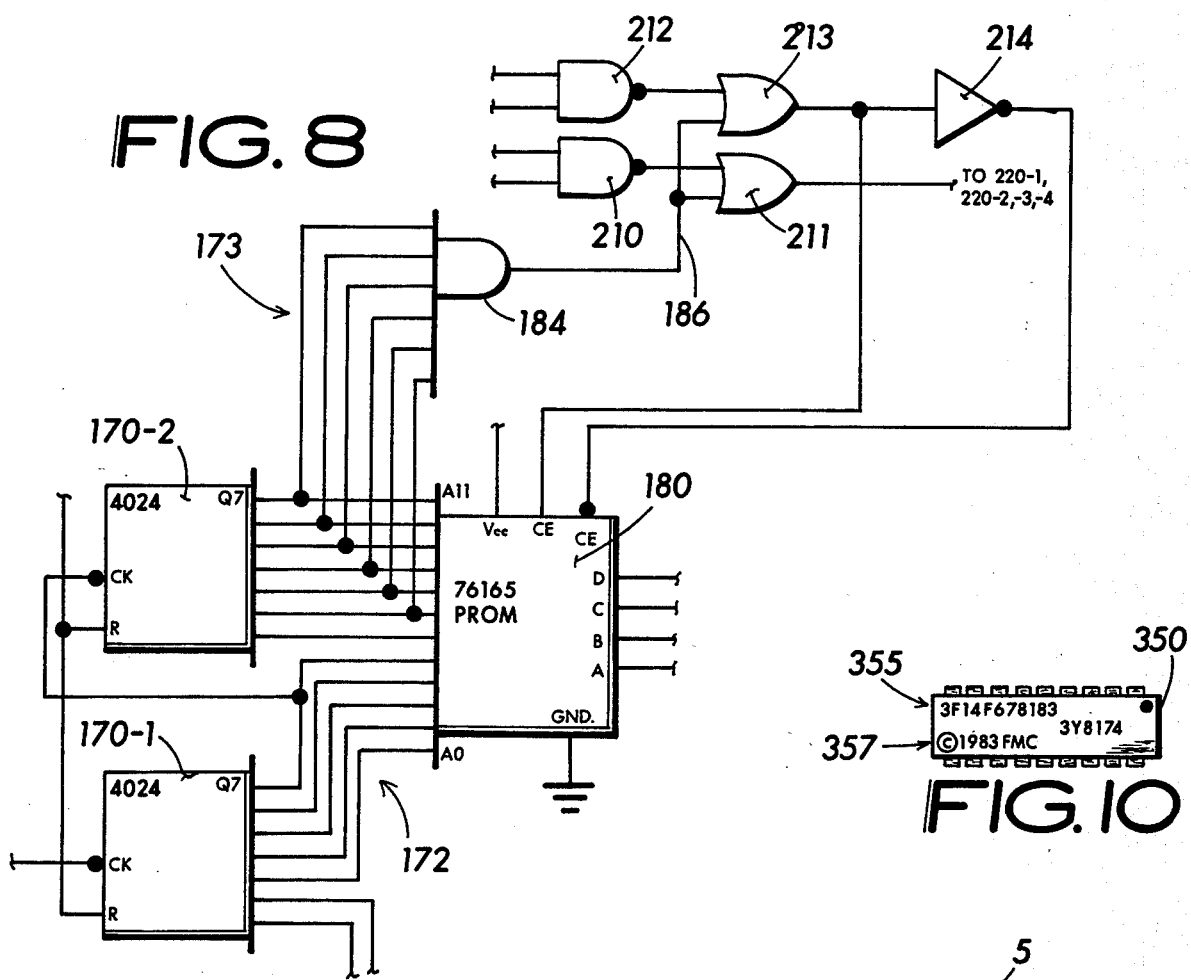
FIG. 8 Electrical provision for restricting overwriting in a portion of reserved indicia bearing top memory.

FIG. 8 shows an AND gate coupled with the data signals 173 obtained from the output of memory address counter 170-2 thereby reserving the top bits of memory for storage of a covert indicia, such as the vehicle identification number. The AND gate 184 produces a HIGH signal 186 which couples with OR gate 211, 213 interspersed between the NAND gates 210, 212 and the following circuitry. The result is that when all HIGH levels are produced on the top six most significant bits of counter 170-2, further memory writing is inhibited.

Figure 9:
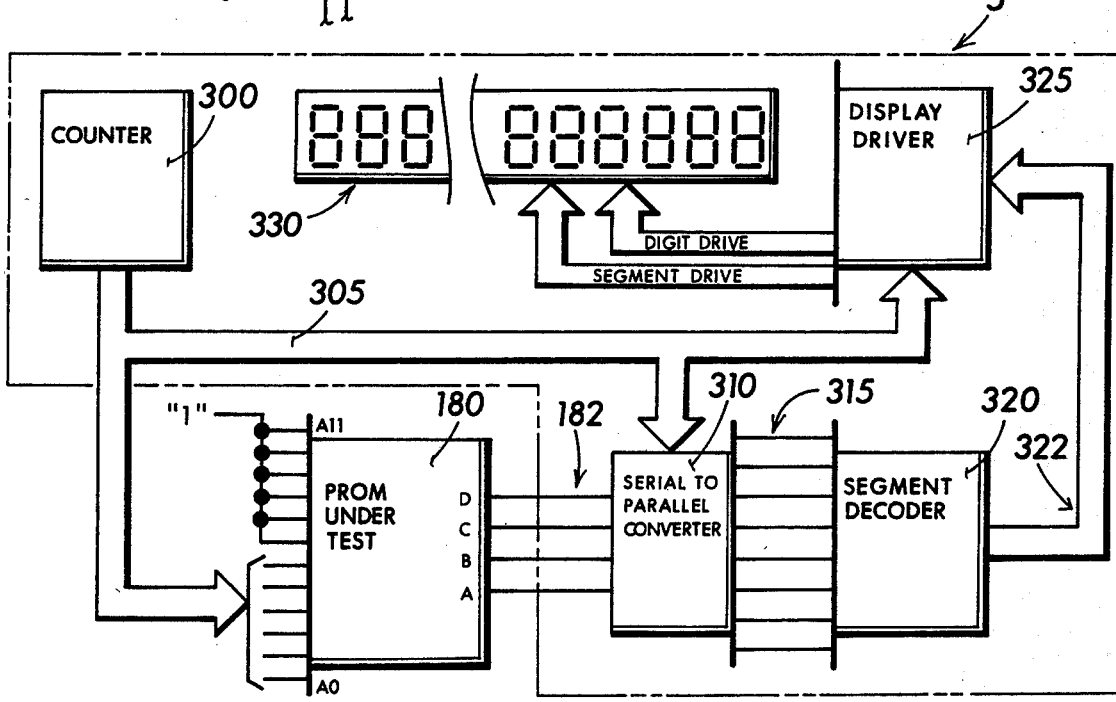
FIG. 9 Block diagram for portable apparatus suited for reading out reserved top memory indicia.

FIG. 9 depicts a portable device that may be used in conjunction with the instant invention to read out the covert data stored in top memory. The counter 300 addresses the six least significant bits of the PROM 180, while the six most significant bits are held HIGH. This results in a data signal 182 to be obtained from memory and coupled with the serial-to-parallel converter 310 that produces a signal 315 which is decoded 320. The decoded signal 322 couples through the display driver 325, providing the digit and segment drive signals to a multi-digit display 330. The PROM address counter signal 305 also serves as the decode signal for the display driver and the serial-to-parallel drive signal for the converter 310. The result is that the top six addressed bits of information, comprising a field of 256 memory cell bits, is available to store covert information such as the vehicle identification number, etc., which may now be quickly read out by this device.

Figure 10:
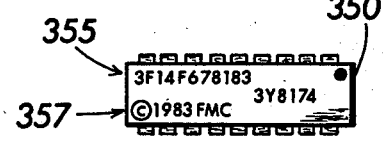
FIG. 10 PROM is depicted to include VIN, part number, copyright notice and other protective labelling.

FIG. 10 shows the PROM 350 embodied in the form of an integrated circuit. The vehicle identification number 355, or other such key information is emblazoned thereon. Also shown is the presence of a copyright notice and a part number, etc. The use of a proprietary non-standard pin-out arrangement for the integrated circuit PROM is anticipated as a ready means for further thwarting the substitution of a counterfeit PROM or other unauthorized tampering.

Although my invention is herewithin described with a certain degree of particularity to enable a person skilled in the art to imitate the fruits of my teachings, it shall be understood that this serves merely to example the essence of my invention's novelty in the form of several possible embodiments and that any changes in the detail thereof may be resorted to without departing from the spirit and scope of the underlying inventive act as claimed.

What is claimed:

1. Pulse counting and display storage method for storing an effectively highest successive count value as a progression of substantially permanent incremental storage cell state changes in a programmable memory means, including the steps of:
    a. providing a seriate plurality of pulse signals;
    b. advancing the effective address states of a memory means by one incremental storage cell location for each provided component pulse signal;
    c. entering at least a one bit and substantially permanent memory state change for each addressed said storage cell;
    d. counting the effective number of incremental storage cell state changes entered and producing a binary word signal having a value representative of the effectively highest count; and
    e. displaying said binary word signal value.

2. Storage method of claim 1 including the further step of:
    counting the effective number of provided component said pulse signals and therefrom producing a plurality of binary address states coupled with the memory means.

3. Storage method of claim 1 including the further step of:
    producing a write signal substantially coincident with each address state advancement of the memory means, whereby said write signal is effective to permanently alter the state of at least one memory information bit comprising the instantly addressed storage cell location.

4. Storage method of claim 3 wherein some predetermined plurality of memory storage cells are protected from alteration by said write signal, thereby providing for the effectively permanent retention of indicia data words therewithin.

5. Storage method of claim 1 wherein the further steps of:
    obtaining the pulse signals from a motor vehicle drive train whereby each unit of vehicle travel distance effectively provides a component pulse signal; and,
    displaying the obtained binary word value as the effective cumulative vehicle travel distance.

6. Pulse counting and display storage apparatus for providing a substantially non-volatile memory storage of each effectively highest successive count value obtained from a seriate plurality of pulse signals, as a virtually permanent incremental storage cell state change in a programmable memory means; comprising therefor:
  a. pulse signal source means;
  b. programmable memory means coupled with said pulse signal source means including address signal source means effective to incrementally advance the memory means effective storage cell location address for each component pulse signal occurrence;
  c. memory writing means coupled with said memory means and effective in response to each component pulse signal occurrence to produce a substantially permanent incremental bit state change of the storage cell at the memory means location effectively coincident with the incremental advance of the memory address signal value; and,
  d. first display means coupled with said address signal source means, effective to produce sensory value indication equivalent to that of the memory address signal value.

7. Storage apparatus of claim 6 wherein further said address signal source means includes:
  a. clock signal source means;
  b. address location counter means producing a memory address signal coupled with said memory means and having an effective first clock input means coupled with said clock signal source means and an effective second clock input means coupled with said pulse signal source means;
  c. memory state detector means coupled with said memory means and said location counter means effective to enable rapid incremental advancement of the memory address signal by the clock signal for each successive said changed storage cell state and to inhibit said rapid incremental advancement coincident with detection of a first yet unchanged storage cell state; and,
  d. startup reset means coupled with said location counter means and effective to initialize the produced memory address signal to a least state value.

8. Storage apparatus of claim 7 wherein said first display means is further coupled with said state detector means and effectively disabled from producing sensory indication whilst rapid incremental memory address advancement is enabled.

9. Storage apparatus of claim 6 effective as motor vehicle odometer and including:
  a. motor vehicle means including a drive train means; and,
  b. said pulse signal source means coupled with said drive train means and effective to produce a component pulse signal occurrence for each effective preferred unit of measure for the distance travelled by said motor vehicle means.

10. Storage apparatus of claim 7 wherein said writing means is further coupled with said state detector means and effectively disabled from producing incremental state changes in the storage cells whilst rapid incremental memory address advancement is enabled.

11. Storage apparatus of claim 6 wherein said memory means further comprises:
  a. first storage means effective for holding a first plural bit order signal sequence representative of at least one of the less significant values indicated by the first display means, wherein the bit states therein stored are effectively held as long as power is coupled therewith;
  b. second storage means effective for holding a second plural bit order signal sequence representative of the more significant values indicated by the first display means, wherein the order of the bit states therein stored are effectively held as substantially permanent state changes which are not lost when power is decoupled and recoupled therewith.

12. Storage apparatus of claim 11 further comprising:
  a. said first storage means comprising first counter means having an effective CLOCK input thereto coupled with said pulse signal source means and the output therefrom coupled with at least one of the less significant first display means indicating elements;
  b. said second storage means comprising second counter means having an effective CLOCK input thereto coupled with said first counter means most significant bit output means and the output therefrom coupled with at least one of the more significant first display means indicating elements;
  c. said second storage means further comprising second counter run-up control means, including at least the programmable memory means and the memory writing means, further having memory address counter means including a CLOCK input thereto effectively coupled with the same signal provided the CLOCK input of the second counter means.

13. Storage apparatus of claim 9 providing resettable trip odometer means comprising:
  a. third counter means having a clock input coupled with said pulse signal source means and thereby effect incremental advance of the third counter output means binary states in response to each said component pulse signal occurrence;
  b. second display means effective to produce sensory value indication equivalent to that of any instant binary state value coupled thereto from the third counter output means; and,
  c. odometer reset means having operator actuatable control means therefor, coupled with and effective to selectively initialize said third counter and thereby effectively produce a "zero" second display means indication.

14. Storage apparatus of claim 9 wherein said address signal source means includes address restriction means effective to protect and therefor inhibit at least the memory writing means from producing state changes in a predetermined number of usually highest level storage cell positions, whilst the protected storage cell positions have therein stored a predefined binary pattern representative of key indicia, such as said motor vehicle means identification numbers.

15. Storage apparatus of claim 14 wherein third display means is provided responsive to said protected storage cell positions to produce effective readout of the key indicia stored therein.

16. Pulse counting and display storage apparatus for producing an effectively retrievable count value stored in programmable memory means as a succession of storage cell state changes; comprising therefor:
  a. pulse signal source means;
  b. programmable memory means;
  c. memory address means coupled with said pulse signal source means, and said programmable memory means, effective to progressively advance the addressed memory position by at least one increment for each component pulse signal occurrence;

d. memory writing means coupled with said programmable memory means and said pulse signal source means, effective to produce an effective state change in the addressed memory position for each component pulse signal occurrence;

e. first display means coupled with said memory address means, effective to produce an indication representative of the memory address position value.

17. Storage apparatus of claim 16 wherein said programmable memory means comprises a plural arrangement of storage cells, each of which is successively addressed by said memory address means, wherein further said memory writing means produces an effectively irreversible change, such as "blowing a fusible element" therein, for each progressively entered memory position state change.

18. Storage apparatus of claim 16 further including:
   a. clock signal source means;
   b. said memory address means including address location counter means producing a memory address signal coupled with said memory means having first clock input means thereto coupled with said clock signal source means and second clock input means coupled with said pulse signal source means;
   c. memory state detector means coupled with said memory means and said location counter means effective for enabling rapid incremental advancement of the location counter means by the clock signal for each successively addressed changed memory means state, and to effectively inhibit said rapid incremental advancement coincident with detection of a first yet unchanged memory position state; and,
   d. startup reset means coupled with said location counter means to effectively initialize the produced memory address signal to a least state value.

19. Storage apparatus of claim 17 effective as a motor vehicle odometer, wherein the entered travel distance is stored as substantially permanent data, including therefor:
   a. motor vehicle means; and,
   b. said pulse signal source means coupled with said motor vehicle means and effective to produce a component pulse signal occurrence for each effective preferred unit of measure representative of the distance travelled by said motor vehicle means.

20. Storage apparatus of claim 19 effective to conserve programmable memory space requirement through utilization of only the more significant units of accumulated distance for permanent storage, including therefor:
   a. first storage means effective for retaining the state order of at least the less significant bits representing the accumulated distance as long as power is coupled thereto:
   b. second storage means effective for retaining the state order of the more significant bits representing the accumulated distance as substantially permanent storage cell state changes; and,
   c. said first display means effective to produce a combined, and usually visual, indication of the values resident in the first storage means and second storage means for observation by an operator of the motor vehicle as an indication of the total accumulated travel distance.

* * * * *